United States Patent
Ho

(10) Patent No.: US 12,513,941 B2
(45) Date of Patent: Dec. 30, 2025

(54) SEMICONDUCTOR DEVICE AND METHOD FOR FORMING THE SAME

(71) Applicant: Vanguard International Semiconductor Corporation, Hsinchu (TW)

(72) Inventor: Yu-Hao Ho, Hsinchu (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 646 days.

(21) Appl. No.: 17/848,884

(22) Filed: Jun. 24, 2022

(65) Prior Publication Data

US 2023/0420560 A1   Dec. 28, 2023

(51) Int. Cl.
  *H10D 30/65* (2025.01)
  *H01L 21/02* (2006.01)
  (Continued)

(52) U.S. Cl.
  CPC ....... *H10D 30/65* (2025.01); *H01L 21/02236* (2013.01); *H01L 21/02255* (2013.01);
  (Continued)

(58) Field of Classification Search
  CPC .. H10D 30/65; H10D 30/022; H10D 30/0281; H10D 30/603; H10D 62/109;
  (Continued)

(56) References Cited

U.S. PATENT DOCUMENTS

| | | | | |
|---|---|---|---|---|
| 4,868,135 A | * | 9/1989 | Ogura | H10D 84/401 257/370 |
| 5,648,288 A | * | 7/1997 | Williams | H10D 30/603 257/E29.054 |

(Continued)

FOREIGN PATENT DOCUMENTS

| | | |
|---|---|---|
| CN | 1591800 A | 3/2005 |
| CN | 112397567 A | 2/2021 |
| TW | 200511398 A | 3/2005 |

OTHER PUBLICATIONS

Taiwanesa Office Action and Search Report for Taiwanese Application No. 111118306, dated Feb. 13, 2023.

*Primary Examiner* — William B Partridge
*Assistant Examiner* — Alexandre X Ramirez
(74) *Attorney, Agent, or Firm* — Birch, Stewart, Kolasch & Birch, LLP

(57) ABSTRACT

A semiconductor device and a method for forming the same are provided. The semiconductor device includes a semiconductor substrate, a well region, an isolation structure, a gate structure and a field doped region. The well region having a first conductivity type is disposed in the semiconductor substrate. The gate structure extends to cover a portion of the isolation structure in the well region. The field doped region having a second conductivity type is disposed on the well region. The field doped region has a first portion overlapping the isolation structure and a second portion that is connected to the first portion and away from the gate structure. A first depth between a bottom surface of the first (Continued)

portion and a top surface of the semiconductor structure is greater than a second depth between a bottom surface of the second portion and the top surface of the semiconductor structure.

19 Claims, 5 Drawing Sheets

(51) Int. Cl.
| | | |
|---|---|---|
| *H01L 21/265* | (2006.01) | |
| *H01L 21/266* | (2006.01) | |
| *H01L 21/762* | (2006.01) | |
| *H10D 30/01* | (2025.01) | |
| *H10D 30/60* | (2025.01) | |
| *H10D 62/10* | (2025.01) | |
| *H10D 62/17* | (2025.01) | |
| *H10D 84/01* | (2025.01) | |
| *H10D 84/03* | (2025.01) | |
| *H10D 84/85* | (2025.01) | |

(52) U.S. Cl.
CPC ...... *H01L 21/26513* (2013.01); *H01L 21/266* (2013.01); *H01L 21/76202* (2013.01); *H10D 30/022* (2025.01); *H10D 30/0221* (2025.01); *H10D 30/0281* (2025.01); *H10D 30/603* (2025.01); *H10D 62/109* (2025.01); *H10D 62/116* (2025.01); *H10D 62/393* (2025.01); *H10D 84/017* (2025.01); *H10D 84/0191* (2025.01); *H10D 84/038* (2025.01); *H10D 84/85* (2025.01)

(58) Field of Classification Search
CPC .. H10D 62/116; H10D 62/393; H10D 84/017; H10D 84/0191; H10D 84/038; H10D 84/85; H10D 30/0229; H10D 84/135; H10D 18/00; H10D 18/221; H10D 62/199; H10D 62/221; H10D 84/144; H01L 21/02236; H01L 21/02255; H01L 21/26513; H01L 21/266; H01L 21/76202; A23B 2/783; H10H 29/45
See application file for complete search history.

(56) References Cited

U.S. PATENT DOCUMENTS

| | | | | |
|---|---|---|---|---|
| 6,211,552 | B1* | 4/2001 | Efland | H10D 30/0221 |
| | | | | 257/338 |
| 6,225,673 | B1* | 5/2001 | Pendharkar | H01L 29/1083 |
| | | | | 257/500 |
| 6,903,421 | B1 | 6/2005 | Huang et al. | |
| 10,756,187 | B1* | 8/2020 | Tsai | H10D 62/116 |
| 10,910,493 | B2* | 2/2021 | Ko | H10D 62/393 |
| 2004/0227183 | A1* | 11/2004 | Negoro | H10D 84/038 |
| | | | | 257/338 |
| 2005/0142723 | A1 | 6/2005 | Ko | |
| 2006/0113592 | A1* | 6/2006 | Pendharkar | H01L 29/66659 |
| | | | | 257/E29.268 |
| 2009/0026578 | A1* | 1/2009 | Wu | H10D 10/421 |
| | | | | 257/E21.375 |
| 2009/0294849 | A1* | 12/2009 | Min | H10D 62/378 |
| | | | | 257/E29.256 |
| 2017/0287898 | A1* | 10/2017 | Morita | H10D 30/603 |
| 2022/0367388 | A1* | 11/2022 | Sadovnikov | H10D 30/0221 |

* cited by examiner

SEMICONDUCTOR DEVICE AND METHOD FOR FORMING THE SAME

BACKGROUND OF THE INVENTION

Field of the Invention

The disclosure relates to a semiconductor device and a method for forming the same, and, in particular, to a metal-oxide-semiconductor field-effect transistor (MOSFET) device of an ultra-high voltage device process platform and a method for forming the same.

Description of the Related Art

High-voltage semiconductor devices have been applied to the field of high-voltage and high-power integrated circuits (ICs). They have the advantage of being cost-effective and easily compatible with other processes. Therefore, high-voltage semiconductor devices have been widely used in display driver ICs, power supplies, power management, communications, automotive electronics, industrial control, and other applications.

Metal-oxide-semiconductor field-effect transistors (MOSFETs) with different operating voltages are available in ultra-high voltage (UHV) device process platforms. According to the application requirements, it is increasingly becoming necessary to provide MOSFET devices with different application voltages and maintain a small device size without adding additional masks.

BRIEF SUMMARY OF THE INVENTION

An embodiment of the disclosure provides a semiconductor device. The semiconductor device includes a semiconductor substrate, a well region, an isolation structure, a gate structure and a field doped region. The well region having a first conductivity type is disposed in the semiconductor substrate. The isolation structure is disposed on the semiconductor substrate in the well region. The gate structure includes a gate dielectric layer and is disposed on the semiconductor substrate in the well region. The gate structure extends to cover a portion of the isolation structure. The field doped region having a second conductivity type is disposed on the well region, wherein the field doped region has a first portion overlapping the isolation structure and a second portion connected to the first portion and disposed away from the gate structure. A first depth, which is between a bottom surface of the first portion and a top surface of the semiconductor substrate, is deeper than a second depth, which is between a bottom surface of the second portion and the top surface of the semiconductor substrate.

An embodiment of the disclosure provides a semiconductor device. The semiconductor device includes a semiconductor substrate, a well region, an isolation structure, a gate structure and a field doped region. The well region has a first conductivity type, and it is disposed in the semiconductor substrate. The isolation structure is disposed on the semiconductor substrate in the well region. The gate structure is disposed on the semiconductor substrate in the well region. The gate structure extends to cover a portion of the isolation structure. The field doped region is disposed on the well region and partially overlaps the isolation structure, wherein the field doped region has a first bottom surface below the isolation structure and a second bottom surface below a drain pick-up doped region, wherein the second bottom surface is between the first bottom surface and the top surface of the semiconductor substrate along a direction perpendicular to a top surface of the semiconductor substrate.

In addition, an embodiment of the disclosure provides a method for forming a semiconductor device. The method includes forming a first well region in a semiconductor substrate. A pad oxide layer and insulating patterns are formed on the semiconductor substrate. A first field doping process is performed on the semiconductor substrate to form a first portion of a first field doped region in the first well region that is not covered by the insulating patterns and a second portion of the first field doped region in the first well region covered by the insulating patterns, wherein a first depth between a first bottom surface of the first portion of the first field doped region and the top surface of the semiconductor substrate is greater than a second depth between a second bottom surface of the second portion of the first field doped region and the top surface of the semiconductor substrate. A thermal oxidation process is performed to grow the pad oxide layer that is not covered by the insulating patterns in the first well region into a first isolation structure. The insulating patterns are removed. A first gate structure is formed on the semiconductor substrate in the first well region. The first gate structure extends to cover portions of the first isolation structure and the first portion of the first field doped region.

BRIEF DESCRIPTION OF THE DRAWINGS

The disclosure can be more fully understood by reading the subsequent detailed description and examples with references made to the accompanying drawings, wherein.

DETAILED DESCRIPTION OF THE INVENTION

Figure 1:
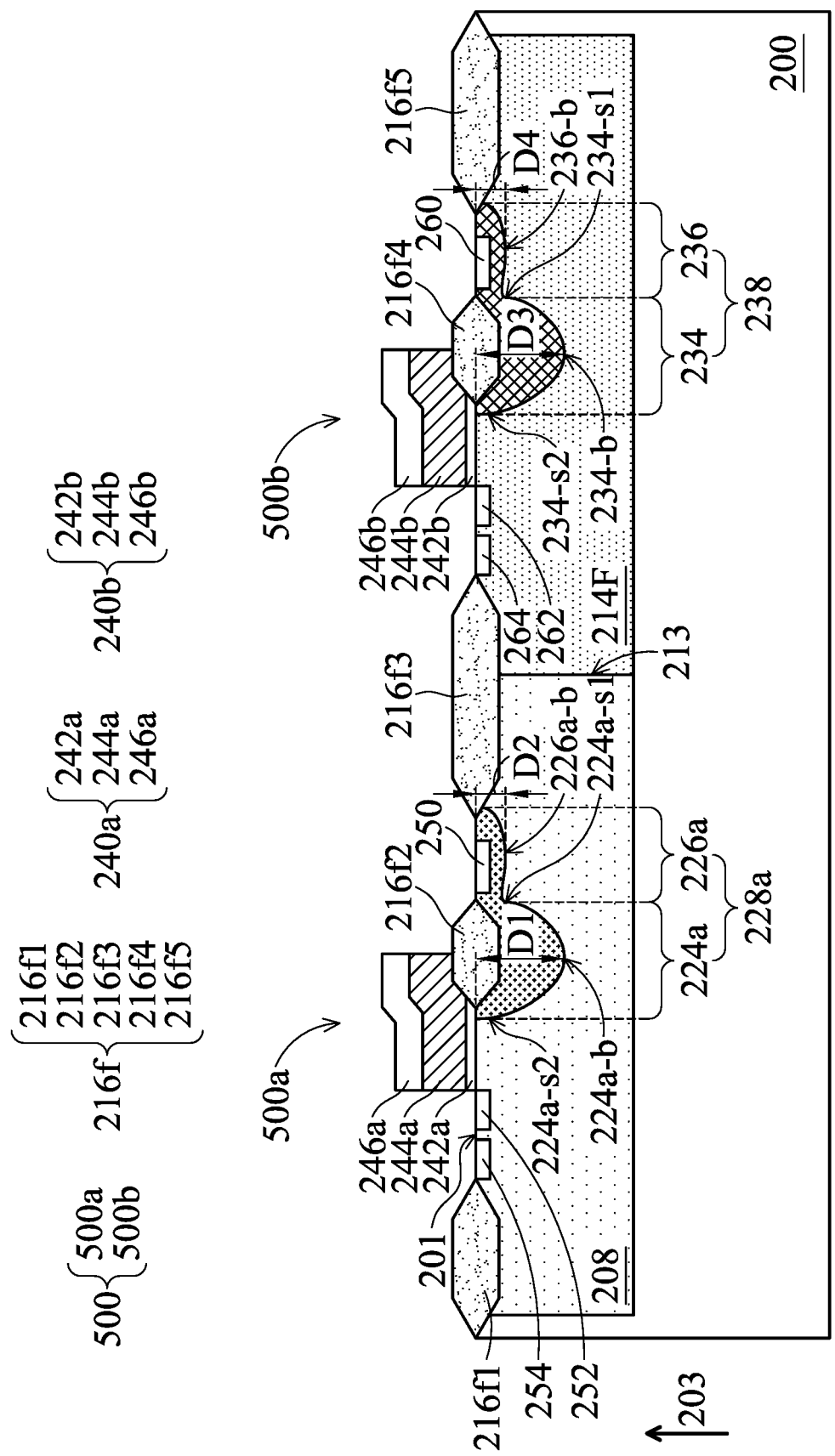
FIG. 1 is a schematic cross-sectional view of a semiconductor device in accordance with some embodiments of the disclosure.

The following description is made for the purpose of illustrating the general principles of the invention and should not be taken in a limiting sense. The scope of the invention is best determined by reference to the appended claims.

The inventive concept is described fully hereinafter with reference to the accompanying drawings, in which exemplary embodiments of the inventive concept are shown. The advantages and features of the inventive concept and methods of achieving them will be apparent from the following exemplary embodiments that are described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. Also, the drawings as illustrated are only schematic and are non-limiting. In the drawings, the size of some of the elements may be exaggerated for illustrative purposes and not drawn to scale. The dimensions and the relative dimensions do not correspond to actual dimensions in the practice of the invention Embodiments provide a semiconductor device and a method for forming the same. In the ultra-high voltage device manufacturing process platform, a metal-oxide-semiconductor field-effect transistor (MOSFET) device with a low operation voltage within 20V and a manufacturing process thereof are provided according to the design requirements in order to increase the application range of the transistor. The aforementioned MOSFET device is disposed in a single well region having a first conductivity type, and utilizes a field implant process for adjusting the doping concentration of another well region having a second conductivity type with the local oxidation of silicon (LOCOS) process to form a field doped region having the second conductivity type in the single well region with the first conductivity type, without adding additional masks. The field doped region may serve as a drain doped region of the MOSFET device. In some embodiments, the doping depth of a portion of the field doped region below the gate structure is greater than the doping depth of another portion of the field doped region away from the gate structure, such that the requirements of the electrical performance and withstand voltage of the device can be achieved. The drain doped region of the MOSFET device is not formed by the well region, and will not be driven in by the thermal process to further diffuse to increase the size of the device, so that the device can be maintained in a small size.

FIG. 1 is a schematic cross-sectional view of a semiconductor device 500 in accordance with some embodiments of the disclosure. In some embodiments, the semiconductor device 500 includes a first type MOSFET 500a and/or a second type MOSFET 500b, wherein the first type is, for example, a P-type and the second type is, for example, the N-type, but the disclosure is not limited to this, and those skilled in the art can adjust it according to actual needs. In some embodiments, the first type MOSFET 500a includes a semiconductor substrate 200, a well region 208, an isolation structure 216f, a gate structure 240a and a field doped region 228a. In some embodiments, the second type MOSFET 500b includes the semiconductor substrate 200, a well region 214F, the isolation structure 216f, a gate structure 240b and a field doped region 238.

In some embodiments, the semiconductor substrate 200 includes an elementary semiconductor, such as silicon (Si), germanium (Ge), etc.; a compound semiconductor, such as gallium nitride (GaN), silicon carbide (SiC), gallium arsenide (GaAs), gallium phosphide (GaP), indium phosphide (InP), indium arsenide (InAs), indium antimonide (InSb), etc.; an alloy semiconductor, such as SiGe alloy, GaAsP alloy, AlInAs alloy, AlGaAs alloy, GaInAs alloy, GaInP alloy, GaInAsP alloy, or a combination thereof. In addition, the semiconductor substrate 200 may also include a silicon-on-insulator (SOI). In some embodiments, the conductivity type of the semiconductor substrate 200 may be P-type or N-type depending on design requirements.

As shown in FIG. 1, a well region 208 and a well region 214F are disposed in the semiconductor substrate 200. In some embodiments, the well region 208 has a first conductivity type and the well region 214F has a second conductivity type opposite to the first conductivity type. For example, when the well region 208 is an N-type well, the well region 214F is a P-type well, and vice versa. In some embodiments, multiple ion implantation processes may be used to implant dopants having the first conductivity type and the second conductivity type into the semiconductor substrate 200 to form the well region 208 and the well region 214F, respectively. In some embodiments, the dopant of the first conductivity type, for example, an N-type dopant, may include phosphorus, arsenic, nitrogen, antimony, or a combination thereof. In some embodiments, the dopant of the second conductivity type, such as a P-type dopant, may include boron, gallium, aluminum, indium, boron trifluoride ions ($BF_3^+$), or a combination thereof.

As shown in FIG. 1, isolation structures 216f are disposed on the semiconductor substrate 200 in the well region 208 and the well region 214F. In some embodiments, the bottom portion of the isolation structure 216f is embedded in the semiconductor substrate 200, and the top portion of the isolation structure 216f protrudes from a top surface 201 of the semiconductor substrate 200. In some embodiments, the isolation structures 216f include isolation structures 216f/1, 216f/2, 216f/3, 216f/4 and 216f/5, wherein the isolation structures 216f/1 and 216f/2 are disposed on the semiconductor substrate 200 in the well region 208 and separated from each other. The isolation structures 216f/4 and 216f/5 are disposed on the semiconductor substrate 200 in the well region 214F and separated from each other. And the isolation structure 216f/3 is disposed on the semiconductor substrate 200 at an interface 213 between the well regions 208 and 214F and separated from the isolation structures 216f/2 and 216f/4 one another. As shown in FIG. 1, the isolation structures 216f/1, 216f/2 and 216f/3 define the formation position of the resulting first type MOSFET 500a. The isolation structures 216f/3, 216f/4 and 216f/5 define the formation position of the resulting second type MOS transistor 500b. In addition, the isolation structure 216f/3 may serve as an electrical isolation structure for the first type MOSFET 500a and the second type MOSFET 500b. In some embodiments, any number of isolation structures 216f may be provided on the semiconductor substrate 200 depending on design requirements. In some embodiments, the isolation structure 216f is a field oxide (FOX) formed by a local oxidation of silicon (LOCOS) process, a shallow trench isolation trench isolation- (STI) structure formed by a deposition process, or other suitable isolation structures. In some embodiments, the isolation structures 216f are formed by a thermal oxidation process, including a dry oxidation process, a wet oxidation process, or other suitable thermal oxidation processes.

As shown in FIG. 1, the gate structures 240a and 240b are respectively disposed on the semiconductor substrate 200 in the well regions 208 and 214F. More specifically, the gate structure 240a is formed on the semiconductor substrate 200 between the isolation structures 216f/1 and 216f/2, and extends to cover a portion of the isolation structure 216f/2. The gate structure 240b is formed on the semiconductor substrate 200 between the isolation structures 216f/3 and 216f/4 and extends to cover a portion of the isolation structure 216f/4. In some embodiments, the gate structures 240a and 240b include gate dielectric layers 242a and 242b disposed on the semiconductor substrate 200, gate electrodes layers 244a and 244b disposed over the gate dielectric layers 242a and 242b and gate silicide layers 246a and 246b disposed and the gate electrode layers 244a and 244b.

In some embodiments, the gate dielectric layers 242a and 242b include silicon oxide, silicon nitride, silicon oxynitride, high-k dielectric materials, other suitable dielectric materials, and/or a combination thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, and/or dielectric or similar materials. In some embodiments, an oxidation process (such as a dry oxidation process or a wet oxidation process), a deposition process (such as chemical vapor deposition (CVD), molecular beam deposition (MBD), atomic layer deposition (ALD), plasma enhanced chemical vapor deposition (PECVD), or a combination thereof), other suitable processes, or a combination thereof can be used to form a gate dielectric material layer (not shown) on the semiconductor substrate 200, and a patterning process is subsequently performed on the gate dielectric material layer to form the gate dielectric layers 242a and 242b.

In some embodiments, the gate electrode layers 244a and 244b include polysilicon, amorphous silicon, metals (such as tungsten, titanium, aluminum, copper, molybdenum, nickel, platinum, other suitable metals, or a combination thereof), metal alloys, metal nitrides (such as tungsten nitride, molybdenum nitride, titanium nitride, tantalum nitride, other suitable metal nitrides, or a combination thereof), metal oxides (ruthenium oxide, indium tin oxide, other suitable metal oxides, or a combination thereof), other suitable materials, or a combination thereof. In some embodiments, the gate electrode layers 244a and 244b may be implanted with dopants by in-situ doping. In some embodiments, the gate silicide layers 246a and 246b include metal silicides (such as tungsten silicide, titanium silicide, cobalt silicide, nickel silicide, platinum silicide, erbium silicide, other suitable metal silicides, or a combination thereof). In some embodiments, a gate electrode material layer and a gate silicide material layer (not shown) can be sequentially formed on the gate dielectric layers 242a and 242b using chemical vapor deposition (CVD) (such as low pressure vapor deposition (LPCVD) or plasma enhanced chemical vapor deposition (PECVD)), physical vapor deposition (PVD) (such as resistive heating evaporation, electron beam evaporation, or sputtering), electroplating, atomic layer deposition (ALD), other suitable processes, or a combination thereof. A patterning process is then performed on the gate electrode material layer and the gate silicide material layer to form the gate electrode layers 244a and 244b and the gate silicide layers 246a and 246b. The patterning process can simultaneously pattern the gate dielectric material layer to form the gate dielectric layers 242a and 242b. In some embodiments, the patterning process includes an etching process such as a dry etching process.

As shown in FIG. 1, the field doped regions 228a and 238 are respectively disposed on and surrounded by the well regions 208 and 214F. In some embodiments, the field doped region 228a has the second conductivity type that is opposite to the conductivity type of well region 208 (the first conductivity type). The field doped region 238 has the first conductivity type that is opposite to the conductivity type of the well region 214F (the second conductivity type). For example, when the well region 208 is an N-type well region 208 and the well region 214F is a P-type well region 214F, the field doped region 228a is a P-type field doped region 228a, and the field doped region 238 is an N-type field doped region 238.

As shown in FIG. 1, the field doped regions 228a and 238 are respectively formed below the isolation structures 216f2 and 216f4, and respectively extend away from the gate structures 240a and 240b, In detail, the field doped region 228a formed in the semiconductor substrate 200 laterally extends from below the isolation structure 216f2 to between the isolation structures 216f2 and 216f3, and is close to the top surface 201 of the semiconductor substrate 200. The field doped region 238 formed in the semiconductor substrate 200 extends from below the isolation structure 216f4 to between the isolation structures 216f4 and 216f5, and is close to the top surface 201 of the semiconductor substrate 200.

In some embodiments, the field doped region 228a of the first type MOSFET 500a has a first portion 224a overlapping the isolation structure 216f2 and a second portion 226a connected to the first portion 224a and extending away from the gate structure 240a. In some embodiments, the gate structure 240a of the first type MOSFET 500a is partially overlapped the first portion 224a of the field doped region 228a along a direction 203 perpendicular to the top surface 201 of the semiconductor substrate 200. In some embodiments, the second portion 226a of the field doped region 228a of the first type MOS transistor 500a adjoins the isolation structure 216f2. In addition, the isolation structure 216f2 does not overlap the second portion 226a of the field doped region 228a at all along the direction 203 of a vertical projection to the semiconductor substrate 200, as shown in FIG. 1.

Similarly, in some embodiments, the field doped region 238 of the second type MOSFET 500b has the same arrangement as the field doped region 228a. The field doped region 238 of the second type MOSFET 500b has a first portion 234 overlapping the isolation structure 216f4 and a second portion 236 connected to the first portion 234 and extending away from the gate structure 240b, as shown in FIG. 1.

As shown in FIG. 1, the first portion 224a of the field doped region 228a of the first type MOSFET 500a has a bottom surface 224a-b and two opposite side surfaces 224a-s1 and 224a-s2 adjoin the bottom surfaces 224a-b. The bottom surface 224a-b of first portion 224a of field doped region 228a is located below the isolation structure 216f2 and partially overlaps the gate structure 240a along the direction 203 of the vertical projection to the semiconductor substrate 200. The second portion 226a of the field doped region 228a of the first type MOSFET 500a has a bottom surface 226a-b. The bottom surface 226a-b of the second portion 226a is connected to the side surface 224a-s1 of the first portion 224a and completely non-overlapping with the isolation structure 216f2 along the direction 203 of the vertical projection to the semiconductor substrate 200. The other side surface 224a-s2 of the first portion 224a of the field doped region 228a of the first type MOSFET 500a, which is opposite to the side surface 224a-s1, is located directly below the gate structure 240a. In some embodiments, the bottom surfaces 224a-b of the first portion 224a of the field doped region 228a of the first type MOSFET 500a and the bottom surface 226a-b of the second portion 226a of the field doped region 228a are not coplanar with each other. In some embodiments, the bottom surfaces 226a-b of the second portion 226a of the field doped region 228a are located between the bottom surface 224a-b of the first portion 224a and the top surface 201 of the semiconductor substrate 200 along the direction 203 perpendicular to adjoin the semiconductor substrate 200. For example, a depth D1 between the bottom surfaces 224a-b of the first portion 224a of the field doped region 228a and the top surface 201 of the semiconductor substrate 200 is greater than a depth D2 between the bottom surface 226a-b of the second portion 226a of the field doped region 228a and the top surface 201 of the semiconductor substrate 200. In some embodiments, the ratio of the depth D1 to the depth D2 is about 3:1 to about 20:1. If the depth D1 is too shallow, the vertical distance between the bottom surfaces 224a-b of the first portion 224a of the field doped region 228a and the isolation structure 216f2 will be too small, or even the first portion 224a of the field doped region 228a cannot be formed below the isolation structure 216f2. Therefore, the maximum operating voltage of the resulting first type MOSFET 500a would be reduced. If the depth D1 is too deep, the first portion 224a and the second portion 226a of the field doped region 228a may be separated from each other and cannot be connected to each other due to the large difference in depth between the first portion 224a and the second portion 226a of the field doped region 228a. Therefore, the resulting first type MOSFET 500a cannot meet the requirements of the desired operating voltage and electrical properties.

Similarly, as shown in FIG. 1, the first portion 234 of the field doped region 238 of the second type MOSFET 500b has a bottom surface 234-b and two opposing side surfaces 234-bs1 and 234-s2 adjoin the bottom surface 234-b. The field doped region 238 has the same arrangement as the field doped region 228a. The bottom surface 234-b of the first portion 234 is located below the isolation structure 216f4 and partially overlaps the gate structure 240b along the direction 203 perpendicular to the top surface 201 of the semiconductor substrate 200. The second portion 236 of the field doped region 238 of the second type MOSFET 500b has a bottom surface 236-b. The bottom surface 236-b of the second portion 236 is connected to the side surface 234-s1 of the first portion 234, and does not overlap the isolation structure 216f4 at all along the direction 203 of the vertical projection to the semiconductor substrate 200. The other side surface 234-s2 of the first portion 234 of the field doped region 238 of the second type MOSFET 500b, which is opposite to the side surface 234-s1, is located directly below the gate structure 240b. In some embodiments, a depth D3 between the bottom surface 234-b of the first portion 234 of the field doped region 238 of the second type MOSFET 500b and the top surface 201 of the semiconductor substrate 200 is greater than a depth D4 between the bottom surface 236-b of the second portion 236 of the field doped region 238 and the top surface 201 of the semiconductor substrate 200. In some embodiments, the ratio of the depth D3 to the depth D4 is about 3:1 to about 20:1. If the depth D3 is too shallow, the vertical distance between the bottom surface 234-b of the first portion 234 of the field doped region 238 and the isolation structure 216f4 will be too small, or even the first portion 234 of the field doped region 238 cannot be formed below the isolation structure 216f4. Therefore, the maximum operating voltage of the resulting second type MOSFET 500b would be reduced. If the depth D3 is too deep, the first portion 234 and the second portion 236 of the field doped region 238 may be separated from each other and cannot be connected to each other due to the large difference in depth between the first portion 234 and the second portion 236 of the field doped region 238. Therefore, the resulting second type MOSFET 500b cannot reach the desired operating voltage and electrical requirements.

In some embodiments, the field doped regions 228a (or the field doped region 238) having different depth portions may be formed by multiple ion implantation steps with different implant energies using an ion implantation process using the insulating patterns (such as silicon nitride patterns) of the local oxidation of silicon (LOCOS) process as an ion implantation mask. The ion implantation process may form the first portion 224a of the field doped region 228a (or the first portion 234 of the field doped region 238) in the semiconductor substrate 200 that is not covered by the silicon nitride mask layer. The ion implantation process may form the second portion 226a of the field doped region 228a (or the second portion 236 of the field doped region 238) in the semiconductor substrate 200 that is covered by the silicon nitride mask layer.

As shown in FIG. 1, the first type MOSFET 500a and the second type MOSFET 500b further include drain pick-up doped regions 250 and 260, source pick-up doped regions 252 and 262 and bulk pick-up doped regions 254 and 264. In some embodiments, the drain pick-up doped regions 250 and 260 of the first type MOSFET 500a and the second type MOSFET 500b are disposed on the second portions 226a and 236 of the field doped regions 228a and 228. In other words, the bottom surfaces 226a-b and 236-b of the second portions 226a and 236 of the field doped regions 228a and 228 are located below the drain pick-up doped regions 250 and 260. Also, the drain pick-up doped regions 250 and 260 and the gate structures 240a and 240b are located on opposite sides of the isolation structures 216f2 and 216f4. In some embodiments, the drain pick-up doped regions 250 and 260 have the conductivity type opposite to the well regions 208 and 214F. For example, when the well region 208 is N-type, the drain pick-up doped region 250 is P-type. When the well region 214F is P-type, the drain pick-up doped region 260 is N-type. In some embodiments, the source pick-up doped regions 252 and 262 of the first type MOSFET 500a and the second type MOSFET 500b are disposed on the well regions 208 and 214F. In addition, the source pick-up doped regions 252 and 262 and the drain pick-up doped regions 250 and 260 are located on opposite sides of the gate structures 240a and 240b, respectively. In some embodiments, the source pick-up doped region 252 has the conductivity type opposite to the well regions 208 and 214F. For example, when the well region 208 is N-type, the source pick-up doped region 252 is P-type. When the well region 214F is P-type, the source pick-up doped region 262 is N-type. In some embodiments, the bulk pick-up doped regions 254 and 264 of the first type MOSFET 500a and the second type MOSFET 500b are respectively disposed on the well regions 208 and 214F and adjacent to the drain doped regions 250 and 260. In some embodiments, the bulk pick-up doped regions 254 and 264 have the same conductivity type as the well regions 208 and 214F 208, respectively. For example, when the well region 208 is N-type, the bulk pick-up doped region 254 is N-type. When the well region 214F is P-type, the bulk pick-up doped region 264 is P-type.

Figure 2:
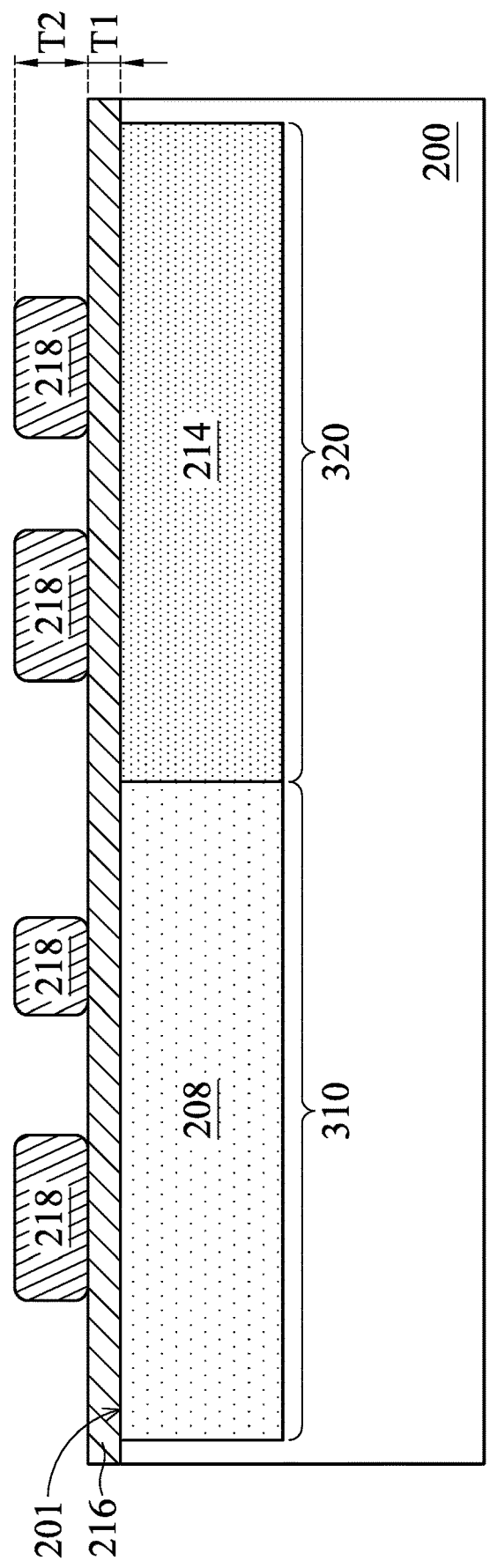
FIGS. 2-5 are schematic cross-sectional views at various stages of forming a semiconductor device in accordance with some embodiments of the disclosure.

A method for forming the semiconductor device 500 is described below. FIGS. 2-5 are schematic cross-sectional views at various stages of forming the semiconductor device 500 in accordance with some embodiments of the disclosure. Referring to FIG. 2, the semiconductor substrate 200 is provided. Next, the well region 208 and the well region 214 adjacent to each other are formed in the semiconductor substrate 200 using an ion implantation process. The well region 208 and the well region 214 may define formation positions of the device regions 310 and 320. The device region 310 may provide the first type MOSFET 500a formed therein, and the device region 320 may provide the second type MOSFET 500b formed therein. In some embodiments, the well region 208 and the well region 214 are formed in different ion implantation steps and implanted with dopants of different conductivity types. For example, the well region 208 having the first conductivity type is formed by implanting an N-type dopant, which may include phosphorus, arsenic, nitrogen, antimony, or a combination thereof. In some embodiments, the well region 214 having the second conductivity type is implanted with a P-type dopant, which may include boron, gallium, aluminum, indium, boron trifluoride ions ($BF_3^+$), or a combination thereof. After the well region 208 and the well region 214 are formed, a diffusion process may be performed, such that the dopant concentrations of the well region 208 and the well region 214 may have an uniform distribution.

Next, a pad oxide layer 216 is formed on the top surface 201 of the semiconductor substrate 200 by oxidizing the top surface 201 of the substrate 200. Then, a deposition process and a subsequent patterning process are performed to form insulating patterns 218 on the pad oxide layer 202. As shown in FIG. 2, the insulating patterns 218 covers portions of the semiconductor substrate 200 in the well region 208 and portions of the semiconductor substrate 200 in the well region 214. In some embodiments, the ratio of a thickness T1 of the pad oxide layer 216 to a thickness T2 of the insulating pattern 218 is about 1:3 to about 1:20. If the thickness T2 of the insulating pattern 218 is too thick, the insulating pattern 218 may completely block the dopant implanted into the semiconductor substrate 200 in the doping step with higher implantation energy of the subsequent ion implantation process for forming the field doped region. Therefore, the depth of the second portion of the subsequently formed field doped region may be too shallow or even the second portion of the subsequently formed field doped region cannot be formed. If the thickness T2 of the insulating pattern 218 is too thin, the insulating pattern 218 may not completely block the dopant implanted into the semiconductor substrate 200 in the doping step with lower implantation energy of the subsequent ion implantation process for forming the field doped region. Therefore, the first and second portions of the subsequently formed field doped region may not achieve the desired depth ratio.

Figure 3:
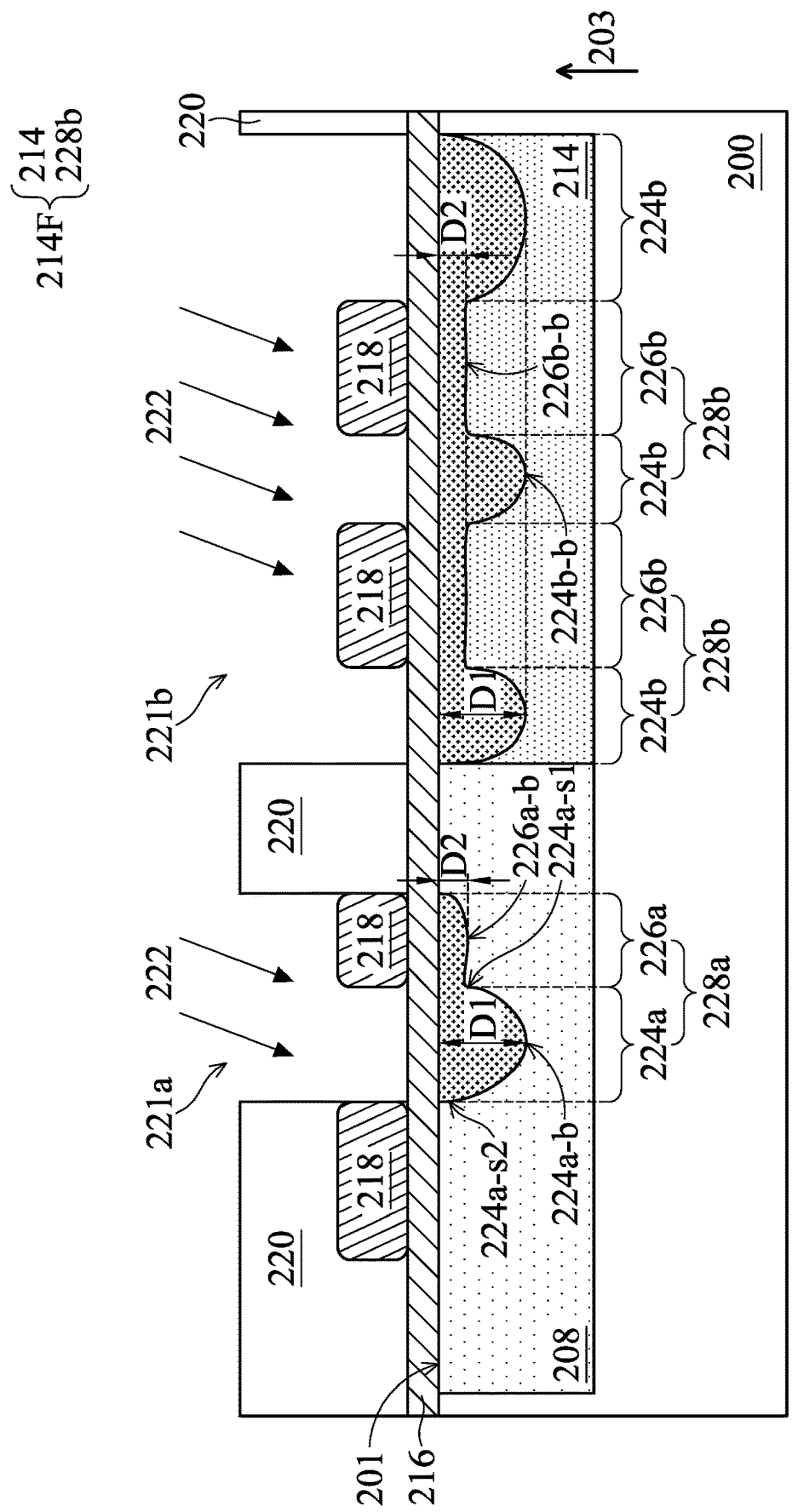

Next, as shown in FIG. 3, a photolithography process is performed to form a photoresist layer 220 covering the semiconductor substrate 200. The photoresist layer 220 may have an opening 221a over the well region 208 and an opening 221b over the well region 214 depending on design requirements. In some embodiments, the area of the opening 221a is smaller than the area of the well region 208 in a top view (that is, a portion of the well region 208 is exposed from the opening 221a). Some of the insulating patterns 218 in the well region 208 and a portion of the pad oxide layer 216 not covered by the insulating patterns 218 are exposed form the opening 221a to define the formation position of the field doped region 228a within the well region 208. In addition, the area of the opening 221b is equal to or greater than that of the well region 214 in a top view (that is, the entire well region 214 is exposed from the opening 221b). All the insulating patterns 218 in the well region 214 and the pad oxide layer 216 not covered by the insulating patterns 218 are exposed form the opening 221b, so that the field doped region 228b is formed on the entire area of the well region 214.

Next, as shown in FIG. 3, a first field doping process 222, such as an ion implantation process, is performed on the semiconductor substrate 200 using the photoresist layer 220 as an ion implantation mask to form the field doped regions 228a on the well regions 208 having the first conductivity type (such as an N-type well region) and the field doped regions 228b on well regions 214 having the second conductivity type (such as a P-type well region). The first field doping process 222 may include multiple ion implantation steps with different implantation energies, and implant dopants of the second conductivity type (such as P-type) into the semiconductor substrate 200. For example, the P-type dopant may include boron, gallium, aluminum, indium, boron trifluoride ion ($BF_3^+$), or a combination thereof. In some embodiments, the first field doping process 222 includes firstly performing the ion implantation step with lower implantation energy on the semiconductor substrate 200 to form a doped region having a shallower depth (not shown) on the first well region 208 not covered by the insulating pattern 218 without forming a doped region on the well regions 208 covered by the insulating patterns 218. In some embodiments, the ion implantation step with higher implantation energy is then performed on the semiconductor substrate 200 to form a doped region having a deeper depth (not shown) on the well region 208 and the well region 214 not covered by the insulating pattern 218, a second portion 226a of the field doped region 228a on the well region 208 covered by the insulating pattern 218 and a second portion 226b of the field doped region 228b on the well region 214 covered by the insulating pattern 218. The shallower doped regions formed by the ion implantation step with lower implantation energy and the deeper doped regions formed by the ion implantation step with higher implantation energy may collectively form the first portion 224a of the field doped region 228a on the well region 208 and the first portion 224b of the field doped region 228b on the well region 214.

In some embodiments, the field doped region 228a having the second conductivity type (such as P-type) formed on the well region 208 having the first conductivity type (such as an N-type well region) partially covers the well region 208. The field doped region 228a may serve as the drain doped region of the resulting first type MOSFET 500a. In some embodiments, the field doped region 228b having the second conductivity type (such as P-type) is formed on the well region 214 having the second conductivity type (such as a P-type well region) to fully cover the well region 214. The field doped region 228b may be used to adjust the doping concentration of the well region 214, so that the devices formed in the well region 214 (such as the second type MOSFET 500b) may have desired electrical properties (including the threshold voltage and the breakdown voltage, etc.). In some embodiments, the doping concentration of field doped region 228b is greater than the doping concentration of well region 214.

In some embodiments, the depth D1 between the bottom surfaces 224a-b of the first portion 224a of the field doped region 228a within the well region 208 and the top surface 201 of the semiconductor substrate 200 is greater than the depth D2 between the bottom surface 226a-b of the second portion 226a of the field doped region 228a and the top surface 201 of the semiconductor substrate 200. Similarly, the depth between the bottom surface 224b-b of the first portion 224b of the field doped region 228b in the well region 214 and the top surface 201 of the semiconductor substrate 200 is the same as the depth D1. The depth between the bottom surface 226b-b of the second portion 226b of the field doped region 228b and the top surface 201 of the semiconductor substrate 200 is the same as the depth D2. In addition, the depth D1 is greater than the depth D2. In some embodiments, the ratio of the depth D1 to the depth D2 is about 3:1 to about 20:1 to meet requirements of the withstand voltage of the first type MOSFET 500a formed in the well region 208, and adjust the doping concentration of the well region 214. Since the field doped region 228b is formed on the entire well region 214 and has the same conductivity type as the well region 214 to adjust the doping concentration of the well region 214, the field doped region 228b and the well region 214 can be collectively annotated as the well region 214F. After the first field doping process 222 is performed, the photoresist layer 220 is removed.

Figure 4:
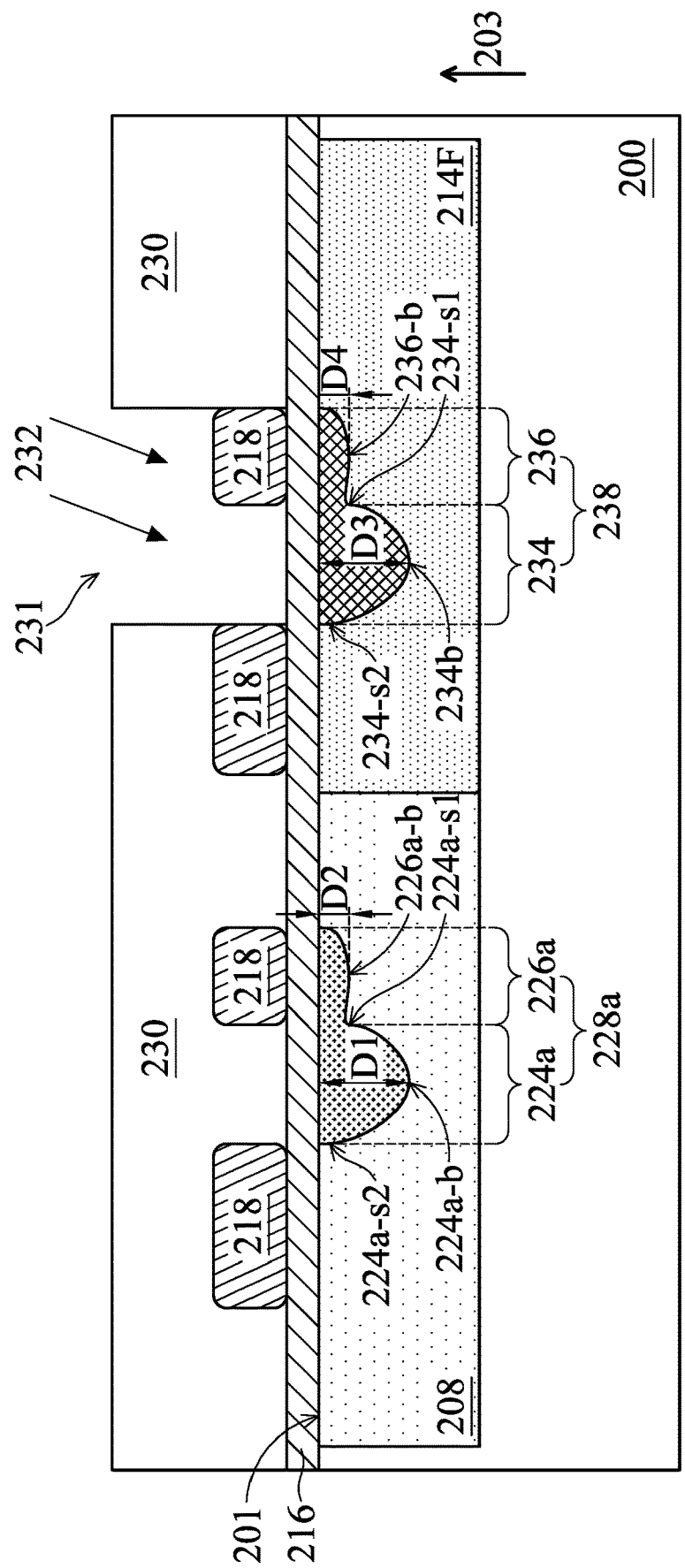

Next, as shown in FIG. 4, a photolithography process is performed to form a photoresist layer 230 covering the semiconductor substrate 200. The photoresist layer 230 can fully cover the well region 208 and has an opening 231 over the well region 214F depending on design requirements. In some embodiments, the area of the opening 231 is smaller than the area of the well region 214F in a top view (that is, a portion of the well region 214F is exposed from the opening 231). Some of the insulating pattern 218 and a portion of the pad oxide layer 216 not covered by the insulating pattern 218 in the well region 214F are exposed to define the formation position of the field doped region 238 within the well region 214F.

Next, as shown in FIG. 4, a second field doping process 232, such as an ion implantation process, is performed on the semiconductor substrate 200 using the photoresist layer 230 as an ion implantation mask to formed the field doped region 238 on the well regions 214F having the second conductivity type (such as a P-type well region). The second field doping process 232 may include multiple ion implantation steps with different implantation energies, and implant dopants of the first conductivity type (such as N-type) into the semiconductor substrate 200. For example, the N-type dopant may include phosphorus, arsenic, nitrogen, antimony, or a combination thereof. In some embodiments, the second field doping process 232 includes firstly performing an ion implantation step with lower implantation energy on the semiconductor substrate 200 to form a doped region (not shown) having a shallower depth on the well region 214F not covered by the insulating pattern 218, and does not form a doped region on the well regions 214F covered by the insulating patterns 218. In some embodiments, an ion implantation step with higher implantation energy is then performed on the semiconductor substrate 200 to form a doped region (not shown) having a deeper depth on the well region 214F not covered by the insulating pattern 218, and form the second portion 236 of the field doped region 238 on the well region 214F covered by the insulating pattern 218. The shallower doped region formed by the ion implantation step with lower implantation energy and the deeper doped region formed by the ion implantation step with higher implantation energy may collectively form the first portion 234 of the field doped region 238 on the well region 214F.

In some embodiments, the field doped region 238 having the first conductivity type (such as N-type) formed on the well region 214F having the second conductivity type (such as a P-type well region) partially covers the well region 214F, The field doped region 238 may serve as the drain doping region of the resulting second type MOSFET 500b.

In some embodiments, a depth D3 between the bottom surface 234-b of the first portion 234 of the field doped region 238 within the well region 214F and the top surface 201 of the semiconductor substrate 200 is greater than the depth D4 between the bottom surface 236-b of the second portion 236 of the field doped region 238a and the top surface 201 of the semiconductor substrate 200. In some embodiments, the depth D3 of the first portion 234 of the field doped region 238 in the well region 214F may be equal to the depth D1 of the first portion 224a of the field doped region 228a in the well region 208. The depth D4 of the second portion 236 of the field doped region 238 in the well region 214F may be equal to the depth D2 of the second portion 226a of the field doped region 228a in the well region 208. In some embodiments, the ratio of the depth D3 to the depth D4 is about 3:1 to about 20:1 to meet the electrical requirements (including the threshold voltage, the breakdown voltage, etc.) of the second type MOSFET 500b formed in the well region 214F having the second conductivity type, and achieve the desired operating voltage range. After performing the second field doping process 232, the photoresist layer 230 is removed.

Figure 5:
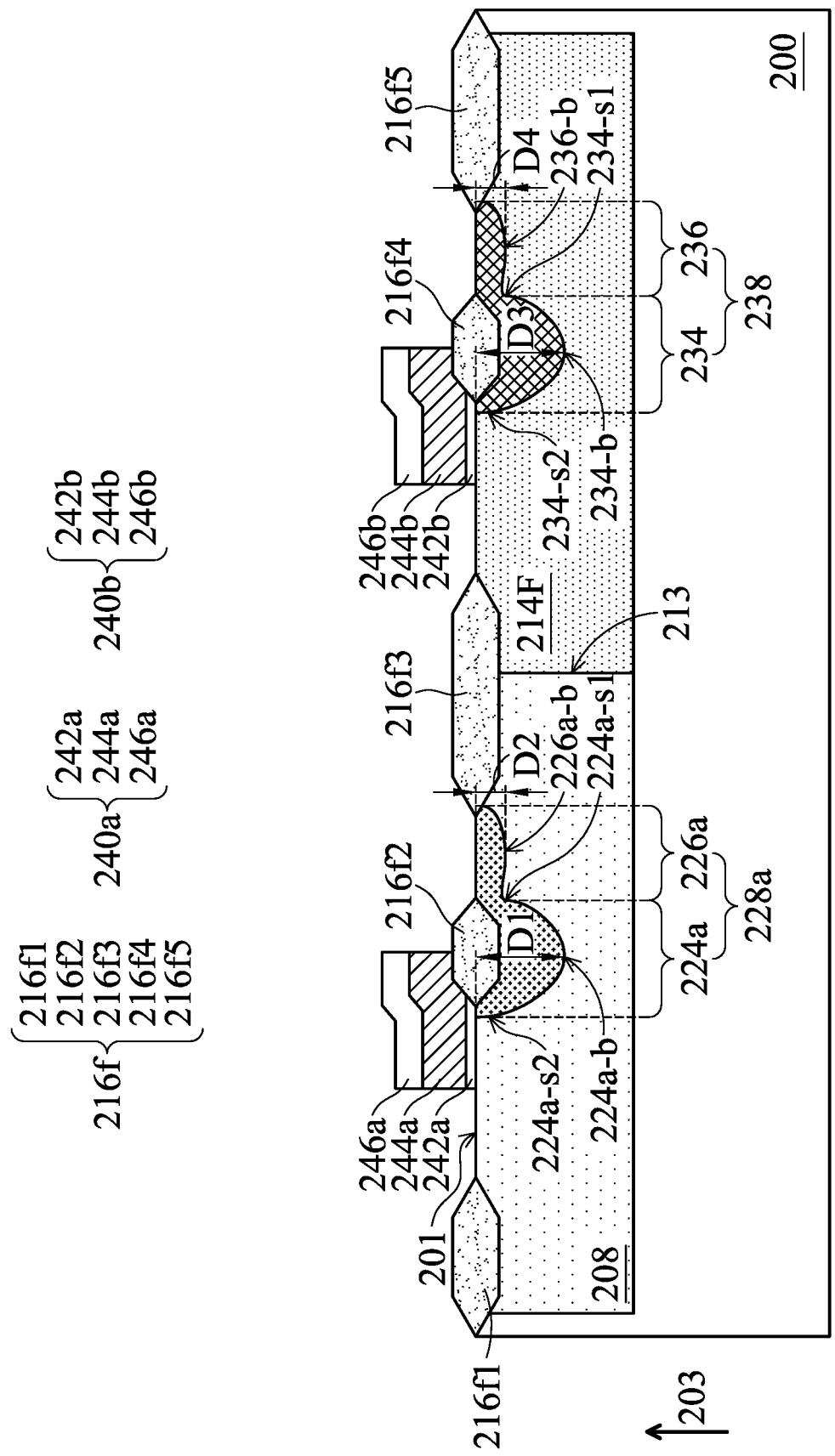

Next, as shown in FIG. 5, a thermal oxidation process of the local oxidation of silicon (LOCOS) process is performed using the insulating patterns 218 as masks to grow the pad oxide layer 216 in the well regions 208 and 214F that is not covered by the insulating pattern 218 into the isolation structures 216f separated from each other. In some embodiments, the isolation structures 216f include isolation structures 216f1 and 216f2 formed on the semiconductor substrate 200 within the well region 208 and separated from each other, the isolation structures 216f4 and 216f5 formed on the semiconductor substrate 200 within the well region 214F and separated from each other, and the isolation structure 216f3 are formed on the semiconductor substrate 200 at the interface 213 between the well regions 208 and 214F. As shown in FIG. 5, the isolation structures 216f1, 216f2 and 216f3 define the formation position of the resulting first type MOSFET 500a. The isolation structures 216f3, 216f4 and 216f5 may define the formation position of the second type MOSFET 500b. In addition, the isolation structure 216f3 may serve as an electrical isolation structure for the first type MOSFET 500a and the second type MOSFET 500b. In some embodiments, any number of isolation structures 216f may be provided on the semiconductor substrate 200 depending on design requirements. After the thermal oxidation process is performed, the insulating pattern 218 is removed.

Next, referring to FIG. 5 again, the gate structures 240a and 240b are formed on the semiconductor substrate 200 and respectively located in the well regions 208 and 214F. A gate dielectric material layer, a gate electrode material layer and a gate silicide material layer (not shown) may be sequentially formed on the semiconductor substrate 200 by a deposition process. Next, a patterning process is performed to pattern the gate dielectric material layer, the gate electrode material layer and the gate silicide material layer (not shown) to form the gate electrodes 240a and 240b. The gate electrode 240a covers a portion of the semiconductor substrate 200 between the isolation structures 216f1 and 216f2, and extends to cover portions of the isolation structure 216f2 and the first portion 224a of the field doped region 228a. The gate electrode 240b covers a portion of the semiconductor substrate 200 between the isolation structures 216f3, 216f4 and extends to cover portions of the isolation structure 216f4 and the first portion 234 of the field doped region 238. The gate structure 240a includes the gate dielectric layer 242a disposed on the semiconductor substrate 200, the gate electrode layer 244a disposed over the gate dielectric layer 242a, and the gate silicide layer 246a disposed over the gate electrode layer 244a. The gate structure 240b includes the gate dielectric layer 242b disposed on the semiconductor substrate 200, the gate electrode layer 244b disposed over the gate dielectric layer 242b, and the gate silicide layer 246b disposed over the gate electrode layer 244b.

Next, referring to FIG. 1, after forming the gate structures 240a and 240b, multiple ion implantation processes may be performed to form the drain pick-up doped regions 250 and 260 on the second portions 226a and 236 of the field doped regions 228a and 238, and form the source pick-up doped regions 252 and 262 and the bulk pick-up doped regions 254 and 264 on the well region 208 away from the field doped regions 228a and 238 and not covered by the gate structures 240a and 240b. After the aforementioned processes, the semiconductor device 500 including the first type MOSFET 500a and/or the second type MOSFET 500b is formed.

In some embodiments, the doping concentrations of the drain pick-up doped region 260 and the source pick-up doped region 262 on the well region 214F is greater than the doping concentration of the field doped region 238. The doping concentration of the base doped region 254 on the well region 208 is greater than the doping concentration of the well region 208.

In addition, an interconnection process can also be performed to form an interconnection structure (not shown) on the semiconductor device 500. In some embodiments, some electrical nodes (not shown) of the interconnection structure may be electrically connected to the drain pick-up doped region 250, the source pick-up doped region 252 and the bulk pick-up doped region 254 of the first type MOSFET 500a. Some other electrical nodes (not shown) of the interconnect structure may be electrically connected to the drain pick-up doped region 260, the source pick-up doped region 262 and the bulk pick-up doped region 264 of the second type MOSFET 500b.

Embodiments of the disclosure provide the semiconductor device 500 and a method for forming the same, which utilize an ultra-high voltage (UHV) (for example, an operating voltage of 700V) process platform to form metal-oxide-semiconductor field-effect transistor (MOSFET) devices with an operating voltage below 20V, the MOSFET devices include the first type MOS transistor 500a and/or the second type MOS transistor 500b.

The semiconductor device in accordance with some embodiments of the disclosure is disposed in a single well region, and uses the field doped region process for controlling the doping concentration of another well region and the local oxidation of silicon (LOCOS) process to form the field doped region on the single well region, which has the opposite conductivity type to that of the single well region, without using additional masks. The field doped region may serve as the drain doped region of the semiconductor device. In some embodiments, the doping depth of the first portion of the field doped region below the gate structure is greater than the depth of the second portion of the field doped region away from the gate structure in order to achieve the requirements of the operating voltage and electrical properties of the device. In addition, the drain doped region of the semiconductor device in accordance with some embodiments of the disclosure is not formed by another well region, such that the device size will not be increased during the thermal diffusion process performed after the formation of the well region. Therefore, the semiconductor device in accordance with some embodiments of the disclosure can maintain a small device size with meeting the requirements of the operating voltage and withstand voltage of the device.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
a semiconductor substrate;
a well region having a first conductivity type disposed in the semiconductor substrate;
an isolation structure disposed on the semiconductor substrate in the well region;
a gate structure comprising a gate dielectric layer and disposed on the semiconductor substrate in the well region and extending to cover a portion of the isolation structure; and
a field doped region having a second conductivity type disposed on the well region, wherein the field doped region has a first portion overlapping the isolation structure and a second portion connected to the first portion and disposed away from the gate structure, a first depth between a bottom surface of the first portion and a top surface of the semiconductor substrate is greater than a second depth between a bottom surface of the second portion and the top surface of the semiconductor substrate, wherein the isolation structure does not overlap the second portion of the field doped region at all in a direction of a vertical projection to the semiconductor substrate, and wherein the isolation structure electrically isolates the gate structure from the field doped region.

2. The semiconductor device as claimed in claim 1, further comprising:
a drain pick-up doped region disposed on the second portion of the field doped region and on an opposite side of the isolation structure from the gate structure, wherein the drain pick-up doped region has the second conductivity type.

3. The semiconductor device as claimed in claim 1, further comprising:
a source pick-up doped region disposed on the well region and on an opposite side of the isolation structure from the drain pick-up doped region, wherein the source pick-up doped region has the second conductivity type; and
a bulk pick-up doped region disposed on the well region and adjacent to the source pick-up doped region, wherein the bulk pick-up doped region has the first conductivity type.

4. The semiconductor device as claimed in claim 1, wherein a ratio of the first depth to the second depth is about 3:1 to about 20:1.

5. The semiconductor device as claimed in claim 1, wherein the gate structure partially overlaps the first portion of the field doped region in a direction of a vertical projection to the semiconductor substrate.

6. The semiconductor device as claimed in claim 1, wherein the first bottom surface of the first portion of the field doped region and the second bottom surface of the second portion of the field doped region are not coplanar with each other.

7. The semiconductor device as claimed in claim 1, wherein the second bottom surface of the second portion of the field doped region is connected to a first side surface of the first portion of the field doped region.

8. The semiconductor device as claimed in claim 6, wherein a second side surface of the first portion of the field doped region opposite to the first side surface of the first portion of the field doped region is located directly below the gate structure.

9. The semiconductor device as claimed in claim 1, wherein the isolation structure comprises a field oxide (FOX) or a shallow trench isolation (STI) structure.

10. The semiconductor device as claimed in claim 1, wherein the second bottom surface is between the first bottom surface and the top surface of the semiconductor substrate along a direction perpendicular to the top surface of the semiconductor substrate.

11. The method for forming a semiconductor device, comprising:
forming a first well region having a first conductivity type in a semiconductor substrate;
forming a pad oxide layer and insulating patterns on the semiconductor substrate;
performing a first field doping process on the semiconductor substrate to form a first portion of a first field doped region in the first well region that is not covered by the insulating patterns and a second portion of the first field doped region in the first well region covered by the insulating patterns, wherein a first depth between a first bottom surface of the first portion of the first field doped region and the top surface of the semiconductor substrate is greater than a second depth between a second bottom surface of the second portion of the first field doped region and the top surface of the semiconductor substrate, wherein the first field doped region has a second conductivity type;

performing a thermal oxidation process to grow the pad oxide layer that is not covered by the insulating patterns in the first well region into a first isolation structure;

removing the insulating patterns; and forming a first gate structure on the semiconductor substrate in the first well region, wherein the first gate structure comprises a gate dielectric layer and extends to cover portions of the first isolation structure and the first portion of the first field doped region, wherein the first isolation structure does not overlap the second portion of the first field doped region at all in a direction of a vertical projection to the semiconductor substrate, and wherein the first isolation structure electrically isolates the first gate structure from the first field doped region.

12. The method for forming a semiconductor device as claimed in claim 11, wherein a ratio of a thickness of the pad oxide layer to a thickness of the insulating patterns is about 1:3 to about 1:20.

13. The method for forming a semiconductor device as claimed in claim 11, further comprising:

forming a photoresist layer to cover the semiconductor substrate before performing the first field doping process, wherein the photoresist layer has an opening exposing portions of the insulating patterns and a portion of the pad oxide layer that is not covered by the insulating patterns to define a formation position of the first field doped region.

14. The method for forming a semiconductor device as claimed in claim 11, further comprising:

forming a first drain pick-up doped region on the second portion of the first field doped region after forming the first gate structure.

15. The method for forming a semiconductor device as claimed in claim 11, further comprising:

forming a first source pick-up doped region on the first well region away from the first field doped region and not covered by the first gate structure after forming the first gate structure; and forming a first bulk doped region on the first well region and adjacent to the first source pick-up doped region.

16. The method for forming a semiconductor device as claimed in claim 11, further comprising:

forming a second well region in the semiconductor substrate and adjacent to the first well region before forming the first field doped region; and forming another first field doped region on the second well region during the first field doping process.

17. The method for forming a semiconductor device as claimed in claim 16, further comprising:

performing a second field doping process on the semiconductor substrate to form a first portion of a second field doped region in the second well region that is not covered by the insulating patterns and a second portion of the second field doped region in the second well region covered by the insulating patterns before performing the thermal oxidation process, wherein a third depth between a first bottom surface of the first portion of the second field doped region and the top surface of the semiconductor substrate is greater than a fourth depth between a second bottom surface of the second portion of the second field doped region and the top surface of the semiconductor substrate.

18. The method for forming a semiconductor device as claimed in claim 17, further comprising:

growing the pad oxide layer in the second well region that is not covered by the insulating patterns into a second isolation structure during the thermal oxidation process; and forming a second gate structure on the semiconductor substrate in the second well region, wherein the second gate structure extends to cover portions of the second isolation structure and the first portion of the second field doped region, wherein the first gate structure and the second gate structure are formed simultaneously.

19. The method for forming a semiconductor device as claimed in claim 18, further comprising:

forming a second drain pick-up doped region on the second portion of the second field doped region after forming the second gate structure;

forming a second source pick-up doped region on the second well region away from the second field doped region and not covered by the second gate structure; and forming a second bulk pick-up doped region on the second well region and adjacent to the second source doped region.

\* \* \* \* \*